(12) United States Patent
Chuang et al.

(10) Patent No.: US 10,868,234 B2
(45) Date of Patent: Dec. 15, 2020

(54) STORAGE DEVICE HAVING MAGNETIC TUNNEL JUNCTION CELLS OF DIFFERENT SIZES, AND METHOD OF FORMING STORAGE DEVICE

(71) Applicant: TAIWAN SEMICONDUCTOR MANUFACTURING COMPANY LTD., Hsinchu (TW)

(72) Inventors: Harry-Hak-Lay Chuang, Hsinchu County (TW); Chang-Hung Chen, Hsinchu (TW); Kuei-Hung Shen, Hsinchu (TW); Wen-Chun You, Yilan County (TW); Tien-Wei Chiang, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/217,681

(22) Filed: Dec. 12, 2018

(65) Prior Publication Data
US 2020/0194662 A1 Jun. 18, 2020

(51) Int. Cl.
| | | |
|---|---|---|
| *G11C 11/00* | (2006.01) | |
| *H01L 43/02* | (2006.01) | |
| *H01L 27/22* | (2006.01) | |
| *G11C 11/16* | (2006.01) | |
| *H01L 43/12* | (2006.01) | |

(52) U.S. Cl.
CPC ............ *H01L 43/02* (2013.01); *G11C 11/161* (2013.01); *G11C 11/1673* (2013.01); *H01L 27/228* (2013.01); *H01L 43/12* (2013.01)

(58) Field of Classification Search
CPC ....... H01L 43/02; H01L 43/12; H01L 27/228; G11C 11/1673; G11C 11/161
USPC ......................................................... 365/158
See application file for complete search history.

(56) References Cited

U.S. PATENT DOCUMENTS

| | | | |
|---|---|---|---|
| 9,437,272 B1* | 9/2016 | Lu ...................... G11C 11/5607 |
| 2006/0104136 A1* | 5/2006 | Gogl ....................... G11C 7/12 365/207 |
| 2008/0198645 A1* | 8/2008 | Kang ..................... G11C 5/025 365/148 |
| 2012/0069638 A1* | 3/2012 | Matsuda ............. G11C 11/1673 365/158 |

(Continued)

OTHER PUBLICATIONS

Yi Liu, et al. High thermal stability in W/MgO/CoFeB/W/CoFeB/W stacks via ultrathin W insertion with perpendicular magnetic anisotropy. Journal of Magnetism and Magnetic Materials 410 (2016), 123-127.

*Primary Examiner* — Tha-O H Bui
(74) *Attorney, Agent, or Firm* — WPAT, P.C., Intellectual Property Attorneys; Anthony King

(57) ABSTRACT

A storage device includes: a plurality of first magnetic tunnel junction (MTJ) cells disposed on a first portion of a substrate; and a plurality of second MTJ cells disposed on a second portion different from the first portion of the substrate; wherein each of the plurality of first MTJ cells has a first cross-sectional surface area viewing from a top of the substrate, each of the plurality of second MTJ cells has a second cross-sectional surface area viewing from the top of the substrate, and the second cross-sectional surface area is greater than the first cross-sectional surface area.

20 Claims, 11 Drawing Sheets

(56) References Cited

U.S. PATENT DOCUMENTS

2014/0071741 A1* 3/2014 Kim ..................... G11C 17/02
365/158
2018/0285005 A1* 10/2018 Torng .................. G06N 3/0454

* cited by examiner

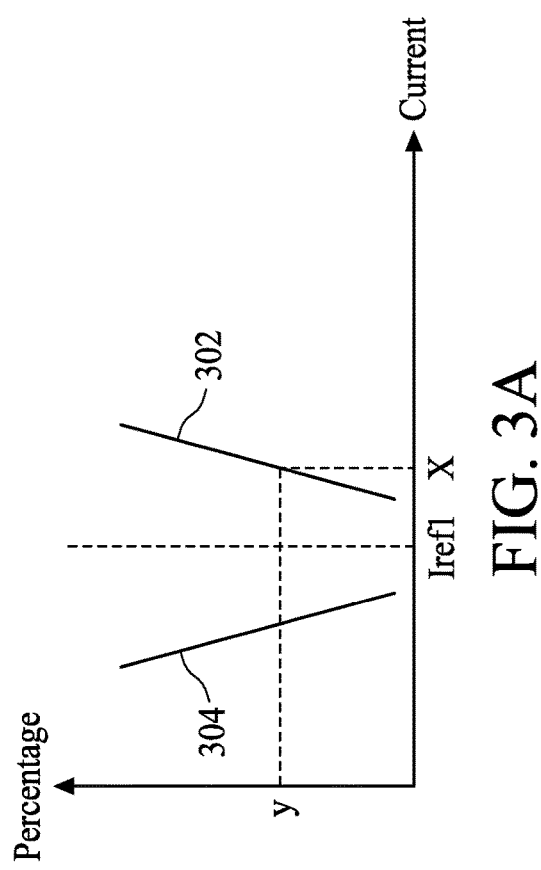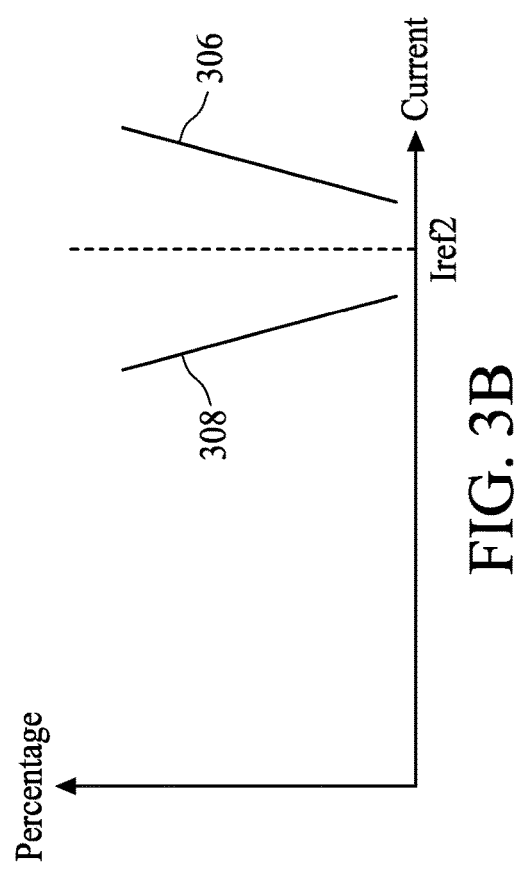
FIG. 3A
FIG. 3B

STORAGE DEVICE HAVING MAGNETIC TUNNEL JUNCTION CELLS OF DIFFERENT SIZES, AND METHOD OF FORMING STORAGE DEVICE

BACKGROUND

Memory devices are used to store information. A recent development in semiconductor memory devices is magnetic random access memory (MRAM) devices. An MRAM cell is a form of non-volatile memory capable of storing bits of digital information (binary 0's or 1's). MRAM digital data is not stored as an electrical charge as in traditional RAM components, rather the bit state (being 0 or 1) is stored via resistive states (high resistance or low resistance) or magnetic states in magnetic storage elements such as magnetic tunnel junctions (MTJs) which do not require constant electrical power to retain their state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a diagram illustrating the current distribution of MTJ cells during the reading operation in accordance with some embodiments.

FIG. 3B is a diagram illustrating the current distribution of MTJ cells during the reading operation in accordance with some embodiments.

DETAILED DESCRIPTION

Figure 1:
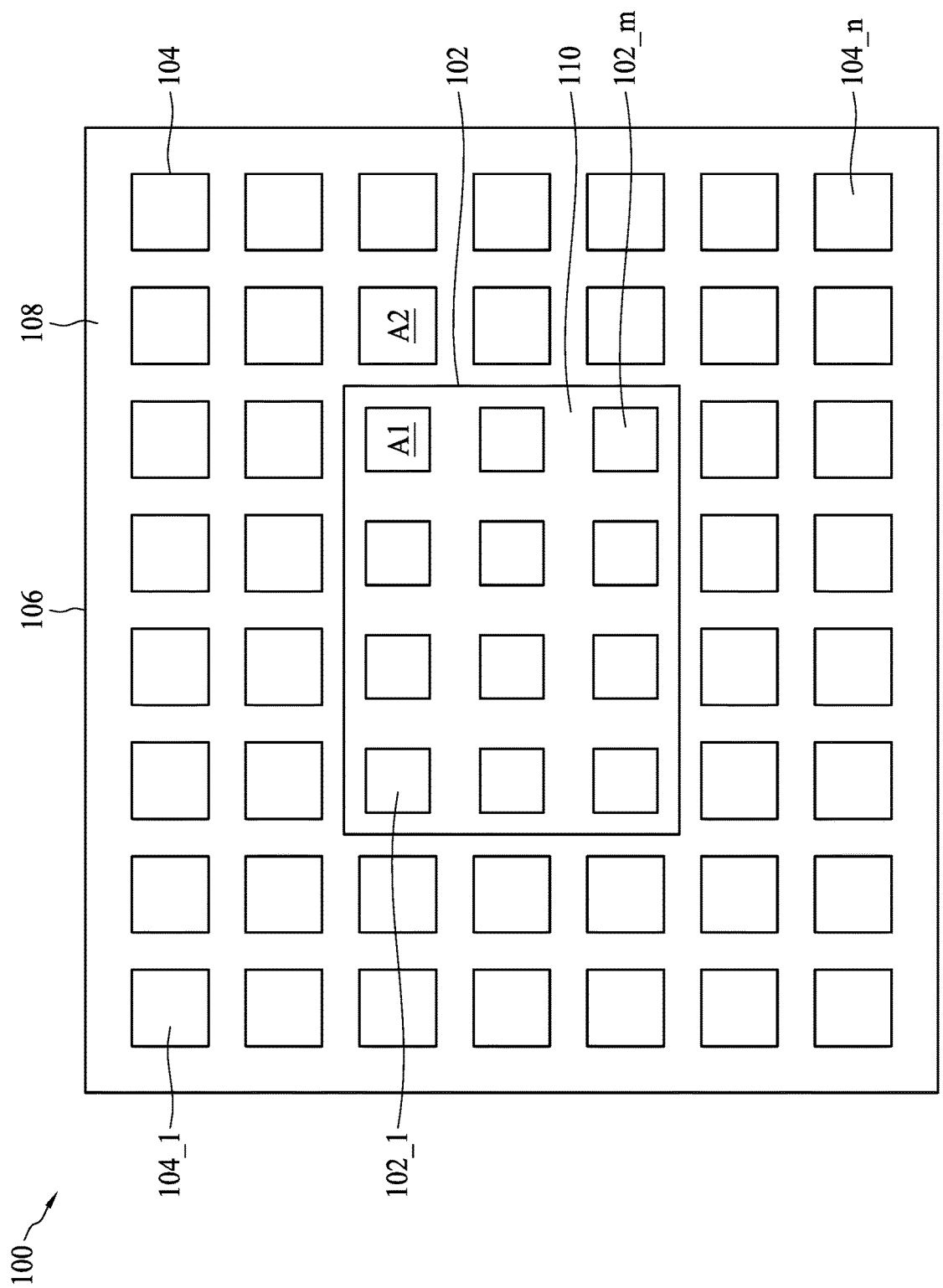
FIG. 1 is a diagram illustrating a storage device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Magnetic Tunnel Junction (MTJ) is a device that changes its resistive state based on the state of magnetic materials within the device. An MTJ device may comprise a thin insulating layer between two ferromagnetic layers. One magnetic layer may be referred to as the reference layer. The other magnetic layer may be referred to as the free layer. The magnetic moment of the reference layer generally maintains the same direction. Conversely, through application of a voltage across the junction, the direction of the magnetic moment of the free layer can be reversed. When the direction of the magnetic moment of both the free layer and the reference layer are the same, electrons can more easily tunnel through the thin insulating layer. In this state, the junction has a relatively low resistivity. Through application of a voltage with the opposite polarity, the magnetic moment of the free layer can be switched to oppose the direction of the magnetic moment of the reference layer. In this state, it is more difficult for electrons to tunnel through the insulating layer, causing the junction to have a relatively high resistivity. The different resistive states can be used to store logical values or data. The data is saved on the MTJ based on different resistance. When the two ferromagnetic layers are anti-parallel, the resistance is relatively high and represents one state such as 0. When the two ferromagnetic layers are parallel, the resistance is relatively low and represents another state such as 1.

One of the two ferromagnetic layers is pinned to a fixed orientation, referred to as a pinned ferromagnetic layer. The pinning effect is achieved by one or two adjacent pinning layers. Another ferromagnetic layer is free to change its orientation during writing by a polarized current above a certain current level, therefore is referred to as a free layer.

Due to non-ideality of the manufacturing process or the process variation, for example, the MTJ devices in an MTJ array may not be identical with each other. Consequently, the voltages used to write (and/or read) each MTJ device in an MTJ array may not be the same voltage. Accordingly, when the MTJ array is fabricated, the MTJ array may undergo a testing or calibration process for determining the appropriate voltages used to write (and/or read) the MTJ devices in the MTJ array. After the testing or calibration process, the information of the voltages used to access (write and/or read) the MTJ devices may be stored in a specific storage device. The information may be stored as a trim code file in the storage device. A controller of the MTJ array may be arranged to read the trim code file from the storage device to obtain the calibrated voltages for accessing the MTJ devices. In other words, when the MTJ array is fabricated and before being proceeded to the packaging process, the MTJ array may undergo the testing process to generate the trim code file. When the trim code file is stored in the storage device, the MTJ array together with the storage device are proceeded to the packaging process. During the packaging process, a solder reflowing process may be performed upon the MTJ array and the storage device. According to some embodiments, the solder reflowing process may not disturb the information, e.g. the trim code file, stored in the storage device. According to some embodiments, the storage device may be the dummy MTJ array disposed around/surround/adjacent to the MTJ array. The sizes of the dummy MTJ devices in the dummy MTJ array may be different from, e.g. larger than, the sizes of the MTJ devices in the MTJ array.

FIG. 1 is a diagram illustrating a storage device 100 in accordance with some embodiments. The storage device 100 comprises a first MTJ array 102 and a second MTJ array 104. The first MTJ array 102 and the second MTJ array 104 are formed on a semiconductor substrate 106. The first MTJ array 102 comprises a plurality of MTJ cells 102_1-102_m. The second MTJ array 104 comprises a plurality of MTJ cells 104_1-104_n. According to some embodiments, the MTJ cells 104_1-104_n may be the dummy MTJ cells of the MTJ cells 102_1-102_m. The semiconductor substrate 106 may comprise a plurality of field-effect transistors (not shown in FIG. 1) coupled to the MTJ cells 102_1-102_m and the MTJ cells 104_1-104_n respectively.

The first MTJ array 102 is formed on a first portion 108 on the semiconductor substrate 106 while the second MTJ array 104 is formed on a second portion 110 on the semiconductor substrate 106, and the first portion 108 is different from the second portion 110. According to some embodiments, the first portion 108 is on the central area of the semiconductor substrate 106, and the second portion 110 is on the peripheral area of the semiconductor substrate 106. The second portion 110 may surround the first portion 108. However, this is not a limitation of the present embodiments. According to another embodiment, the second MTJ array 104 may be formed on the central area of the semiconductor substrate 106, and the first MTJ array 102 may be formed on the peripheral area of the semiconductor substrate 106. In another embodiment, the second MTJ array 104 may be formed on one side, e.g. right, left, or upper side, of the semiconductor substrate 106, and the first MTJ array 102 may be formed on the other side, e.g. left, right, or lower side, of the semiconductor substrate 106.

In this embodiment, the shapes of the MTJ cells 102_1-102_m and the MTJ cells 104_1-104_n are arranged to be cuboid. However, this is not a limitation of the present embodiment. The shapes of the MTJ cells may circular cylinder, elliptical cylinder, hexagonal cylinder, or any polygonal cylinder. In some embodiments, each of the MTJ cells 102_1-102_m has a first cross-sectional surface area A1 viewing from the top of the semiconductor substrate 106, each of the MTJ cells 104_1-104_n has a second cross-sectional surface area A2 viewing from the top of the semiconductor substrate 106, and the second cross-sectional surface area A2 is greater than the first cross-sectional surface area A1.

Figure 2:
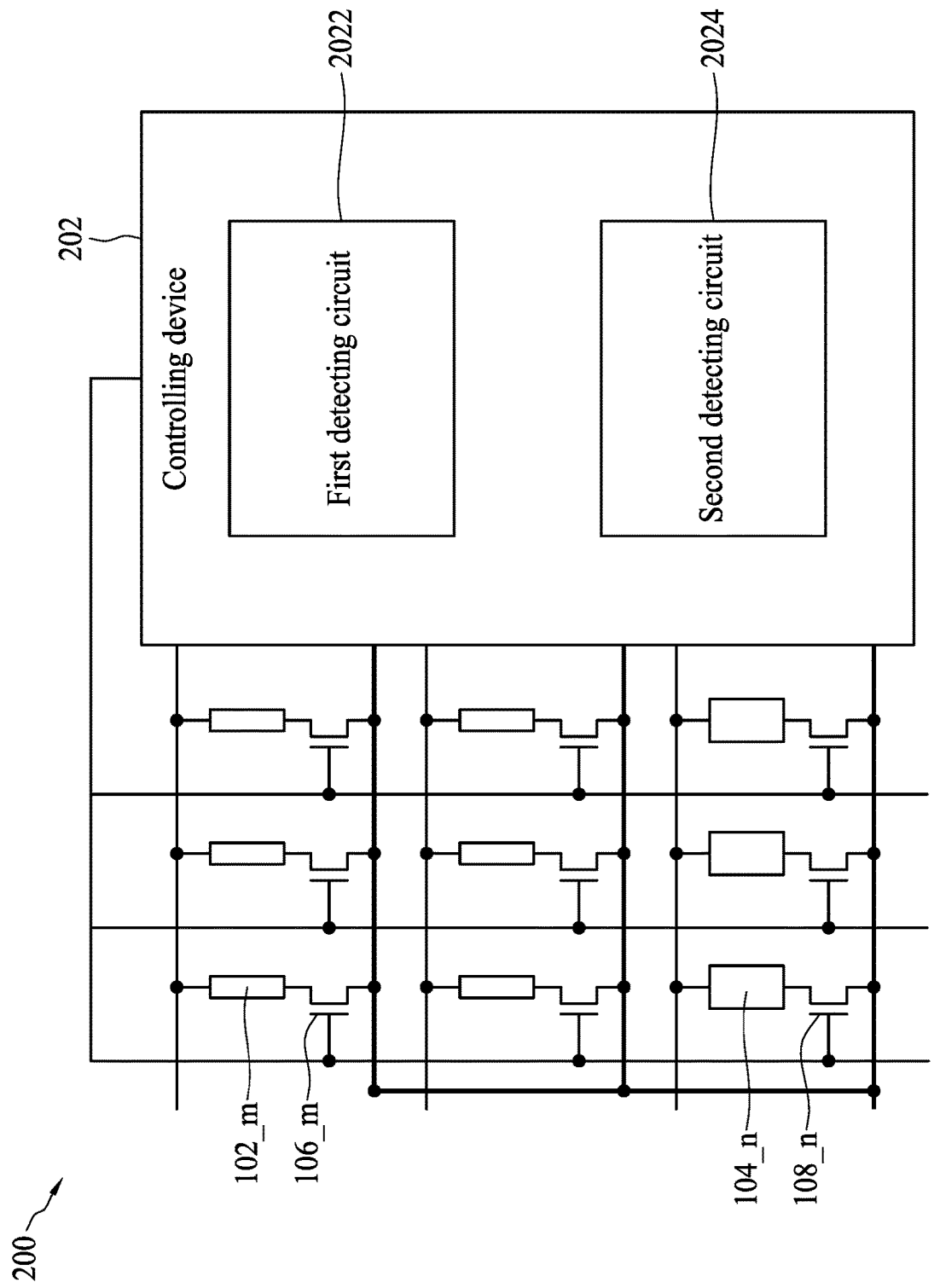
FIG. 2 is a diagram illustrating a storage device in accordance with some embodiments.

According to some embodiments, the MTJ cells 102_1-102_m are arranged to be the normal storage cells, and the MTJ cells 104_1-104_n are arranged to store the trim code file corresponding to the MTJ cells 102_1-102_m. FIG. 2 is a diagram illustrating a storage device 200 in accordance with some embodiments. The storage device 200 comprises the MTJ cells 102_1-102_m, the MTJ cells 104_1-104_n, and a controlling device 202. The controlling device 202 is coupled to the MTJ cells 102_1-102_m and the MTJ cells 104_1-104_n. The storage device 200 further comprises a plurality of field-effect transistors 106_1-106_m and a plurality of field-effect transistors 108_1-108_n. The field-effect transistors 106_1-106_m and the field-effect transistors 108_1-108_n are controlled by the controlling device 202. The field-effect transistors 106_1-106_m are coupled to the MTJ cells 102_1-102_m respectively, and the field-effect transistors 108_1-108_n are coupled to the MTJ cells 104_1-104_n respectively. The field-effect transistors 106_1-106_m are arranged to conduct/provide currents to the MTJ cells 102_1-102_m during the accessing mode (e.g. reading and/or writing operation) of the MTJ cells 102_1-102_m respectively. The field-effect transistors 108_1-108_n are arranged to conduct/provide currents to the MTJ cells 104_1-102_n during the accessing mode (e.g. reading and/or writing operation) of the MTJ cells 104_1-104_n respectively.

As mentioned above, the trim code file stored in the MTJ cells 104_1-104_n may contain the information of the calibrated voltages used to access (write and/or read) the MTJ cells 102_1-102_m. According to some embodiments, the controlling device may be arranged to read the trim code file from the MTJ cells 104_1-104_n to obtain the calibrated voltages of the MTJ cells 102_1-102_m for controlling the MTJ cells 102_1-102_m. According to some embodiments, the controlling device 202 may comprise a first detecting circuit 2022 and a second detecting circuit 2024. The first detecting circuit 2022 is coupled to the MTJ cells 102_1-102_m for detecting the resistive state of each of the MTJ cells 102_1-102_m according to a first reference current Iref1 during the accessing mode (e.g. reading operation) of the MTJ cells 102_1-102_m. The second detecting circuit is coupled to the MTJ cells 104_1-104_n for detecting the resistive state of each of the MTJ cells 104_1-104_n according to a second reference current Iref2 during the accessing mode (e.g. reading operation) of the MTJ cells 102_1-102_m, wherein the second reference current Iref2 is different from the first reference current Iref1. According to some embodiments, the second reference current Iref2 is greater than the first reference current Iref1.

FIG. 3A is a diagram illustrating the current distribution of the MTJ cells 102_1-102_m during the reading operation in accordance with some embodiments. X-axis indicates the currents flowing through the MTJ cells 102_1-102_m with parallel state and anti-parallel state of ferromagnetic layers. Y-axis indicates the percentage of the MTJ cells 102_1-102_m with respect to the current. According to some embodiments, the curve 302 indicates the current distribution of the MTJ cells 102_1-102_m with parallel state. The curve 304 indicates the current distribution of the MTJ cells 102_1-102_m with anti-parallel state. For example, when the ferromagnetic layers of the MTJ cells 102_1-102_m are parallel state, there may have y % of MTJ cells in the MTJ cells 102_1-102_m having magnitude of x current flowing there through when the MTJ cells 102_1-102_m are being read. In addition, due to resistive states of the ferromagnetic layers, when the ferromagnetic layers of an MTJ cell in the MTJ cells 102_1-102_m are parallel state, i.e. the resistance of an MTJ cell is relatively low, the current flowing through the MTJ cell is greater than the first reference current Iref1, i.e. the curve 302. When the ferromagnetic layers of an MTJ cell in the MTJ cells 102_1-102_m are anti-parallel state, i.e.

the resistance of an MTJ cell is relatively high, the current flowing through is smaller than the first reference current Iref1, i.e. the curve 304. According to some embodiments, the first reference current Iref1 is the average of the currents of the curve 302 and the curve 304.

FIG. 3B is a diagram illustrating the current distribution of the MTJ cells 104_1-104_n during the reading operation in accordance with some embodiments. X-axis indicates the currents flowing through the MTJ cells 104_1-104_n with parallel state and anti-parallel state of ferromagnetic layers. Y-axis indicates the percentage of the MTJ cells 104_1-104_n with respect to the current. According to some embodiments, the curve 306 indicates the current distribution of the MTJ cells 104_1-104_n with parallel state. The curve 308 indicates the current distribution of the MTJ cells 104_1-104_n with anti-parallel state. In addition, due to resistive states of the ferromagnetic layers, when the ferromagnetic layers of an MTJ cell in the MTJ cells 104_1-104_n are parallel state, i.e. the resistance of an MTJ cell is relatively low, the currents flowing through the MTJ cell is greater than the second reference current Iref2, i.e. the curve 306. When the ferromagnetic layers of an MTJ cell in the MTJ cells 104_1-104_n is anti-parallel state, i.e. the resistance of an MTJ cell is relatively high, the current flowing through the MTJ cell is smaller than the second reference current Iref2, i.e. the curve 308. According to some embodiments, the second reference current Iref2 is the average of the currents of the curve 306 and the curve 308.

As the second cross-sectional surface area A2 of the MTJ cells 104_1-104_n is greater than the first cross-sectional surface area A1 of the MTJ cells 102_1-102_m, the second reference current Iref2 is greater than the first reference current Iref1. According to some embodiments, the first detecting circuit 2022 is arranged to use the first reference current Iref1 as the reference to determine if an MTJ cell in the MTJ cells 102_1-102_m if parallel state or anti-parallel state. For example, during the reading operation, when the first detecting circuit 2022 detects the current flowing through an MTJ cell is greater than the first reference current Iref1, the first detecting circuit 2022 determines that the magnetic moment of the free layer and the reference layer of the MTJ cell is on parallel state. When the first detecting circuit 2022 detects that the current flowing through an MTJ cell is smaller than the first reference current Iref1, the first detecting circuit 2022 determines that the magnetic moment of the free layer and the reference layer of the MTJ cell is on anti-parallel state.

Specifically, the first detecting circuit 2022 detects the resistive state of an MTJ cell in the MTJ cells 102_1-102_m by comparing the current passing through the MTJ cell with the first reference current Iref1, wherein the field-effect transistor (e.g. 106_m) connecting the MTJ cell is arranged to conduct the current to pass through the MTJ cell. When the current is greater than the first reference current Iref1, the first detecting circuit 2022 determines that the resistance of the MTJ cell is a relatively low resistance. When the current is smaller than the first reference current Iref1, the first detecting circuit 2022 determines that the resistance of the MTJ cell is a relatively high resistance.

The second detecting circuit 2024 is arranged to use the second reference current Iref2 as the reference to determine if an MTJ cell in the MTJ cells 104_1-102_n if parallel state or anti-parallel state. For example, during the reading operation, when the second detecting circuit 2024 detects the current flowing through an MTJ cell greater than the second reference current Iref2, the second detecting circuit 2024 determines that the magnetic moment of the free layer and the reference layer of the MTJ cell is on parallel state. When the second detecting circuit 2024 detects that the current flowing through an MTJ cell is smaller than the second reference current Iref2, the second detecting circuit 2024 determines that the magnetic moment of the free layer and the reference layer of the MTJ cell is on anti-parallel state.

Specifically, the second detecting circuit 2024 detects the resistive state of an MTJ cell in the MTJ cells 104_1-104_n by comparing the current passing through the MTJ cell with the second reference current Iref2, wherein the field-effect transistor (e.g. 108_n) connecting the MTJ cell is arranged to conduct the current to pass through the MTJ cell. When the current is greater than the second reference current Iref2, the second detecting circuit 2024 determines that the resistance of the MTJ cell is a relatively low resistance. When the current is smaller than the second reference current Iref2 the second detecting circuit 2024 determines that the resistance of the MTJ cell is a relatively high resistance.

Accordingly, in the present embodiment, two detecting circuits (e.g. 2022 and 2024) with different reference currents (e.g. Iref1 and Iref2) are arranged to detect the resistive states of the MTJ cells 102_1-102_m and the MTJ cells 104_1-104_n.

Figure 4:
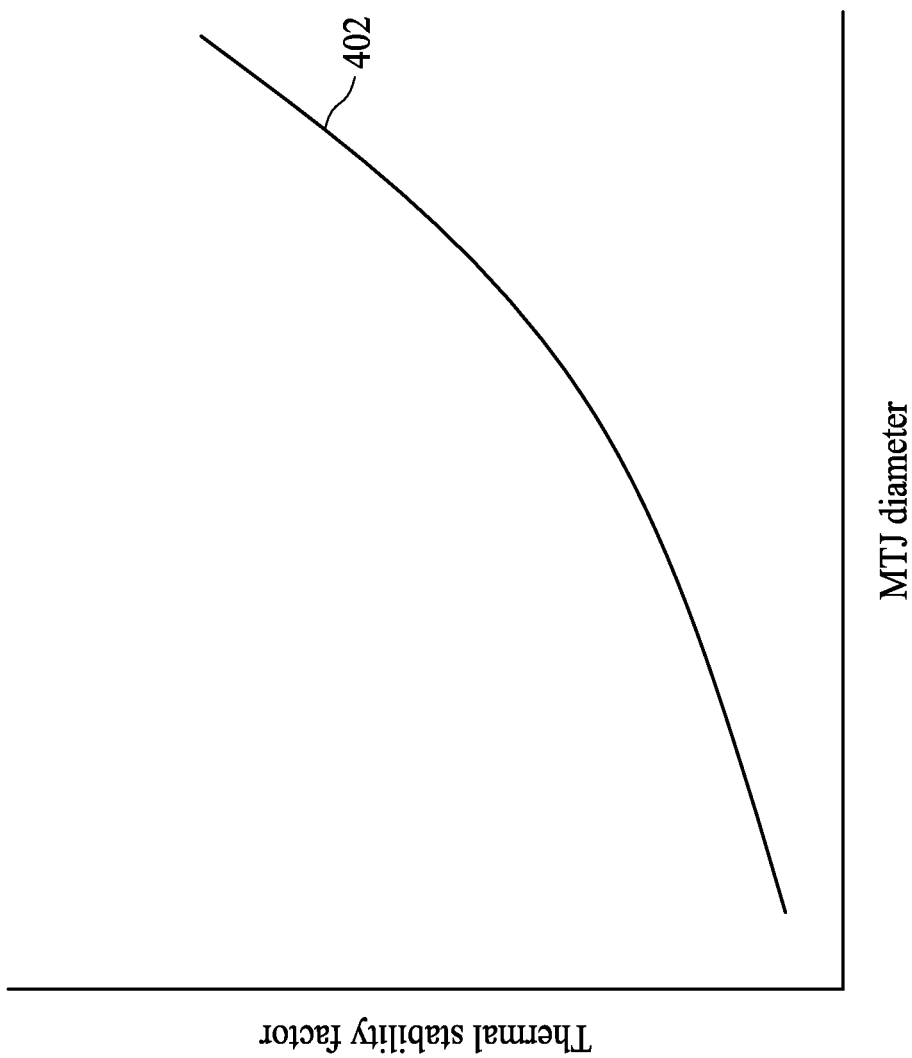
FIG. 4 is a diagram illustrating the thermal stability of an MTJ cell with respect to the diameter of the MTJ cell in accordance with some embodiments.

FIG. 4 is a diagram illustrating the thermal stability of an MTJ cell with respect to the diameter of the MTJ cell in accordance with some embodiments. The curve 402 illustrates the variation of thermal stability of an MTJ cell with respect to the diameter of the MTJ cell. According to FIG. 4, the thermal stability of an MTJ cell is proportional to the diameter (or the cross-sectional surface area) of the MTJ cell. Therefore, the thermal stability of the MTJ cells 104_1-104_n is better than the thermal stability of the MTJ cells 102_1-102_m. When a solder reflowing process is performed upon the storage device 100, the magnetic moment or the resistive states of the MTJ cells 104_1-104_n may not be changed. Accordingly, the information (e.g. the trim codes) stored in MTJ cells 104_1-104_n may not be disturbed by thermal process.

Figure 5:
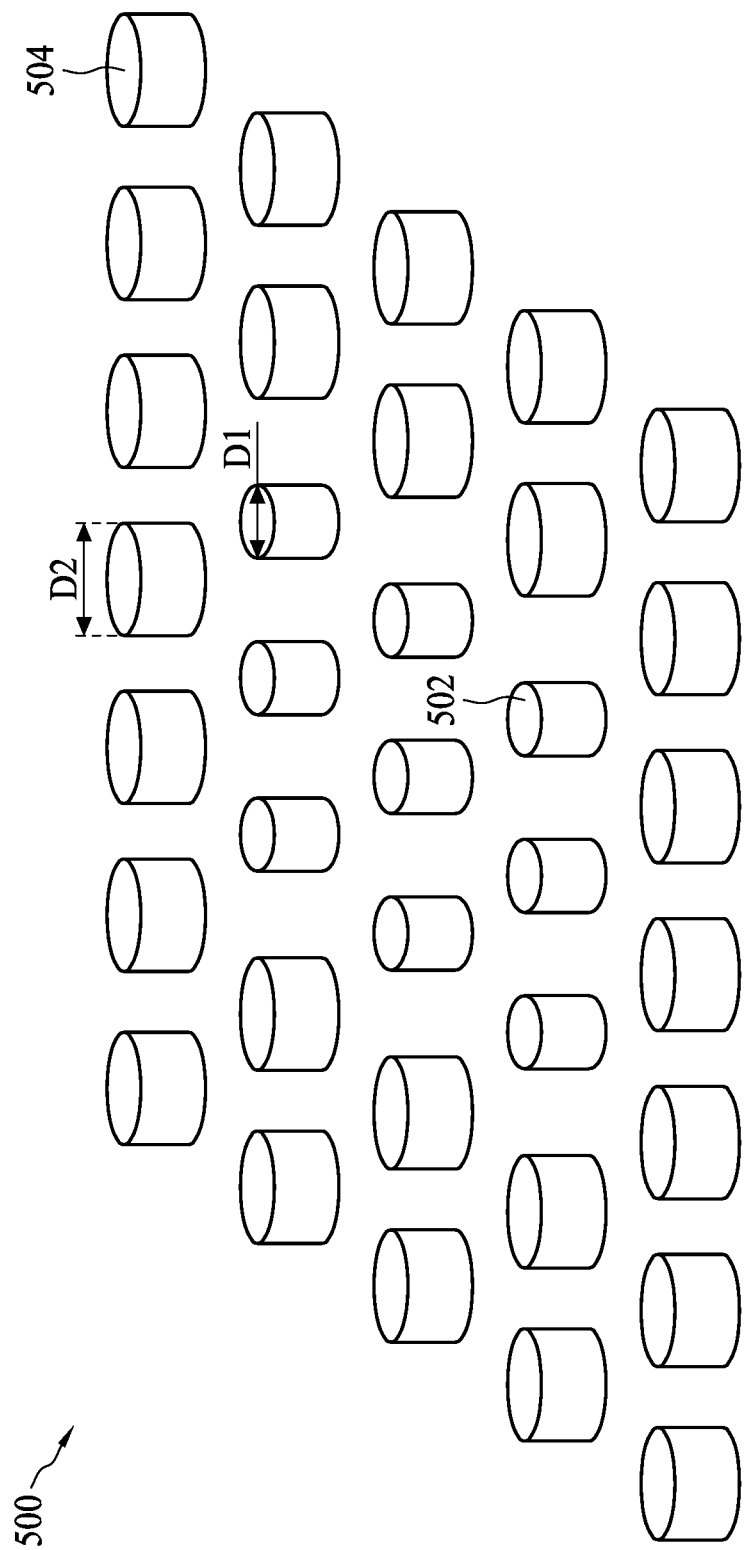
FIG. 5 is a diagram illustrating a storage device in accordance with some embodiments.

FIG. 5 is a diagram illustrating a storage device 500 in accordance with some embodiments. The storage device 500 comprises a first MTJ array 502 and a second MTJ array 504. The first MTJ array 502 and the second MTJ array 504 are formed on a semiconductor substrate (not shown). The first MTJ array 502 comprises a plurality of MTJ cells 502_1-502_m. The second MTJ array 504 comprises a plurality of MTJ cells 504_1-504_n. In this embodiment, the shapes of the MTJ cells 502_1-102_m and the MTJ cells 504_1-504_n are arranged to be circular cylinder. According to some embodiments, the first MTJ array 502 is on the central area of the semiconductor substrate, and the second MTJ array 504 is on the peripheral area of the semiconductor substrate. In addition, the diameter D1 of each of the MTJ cells 502_1-502_m is smaller than the diameter D2 of the MTJ cells 504_1-504_n. The electrical characteristic of the storage device 500 is similar to the storage device 100, and the detailed description is omitted here for brevity.

Figure 6:
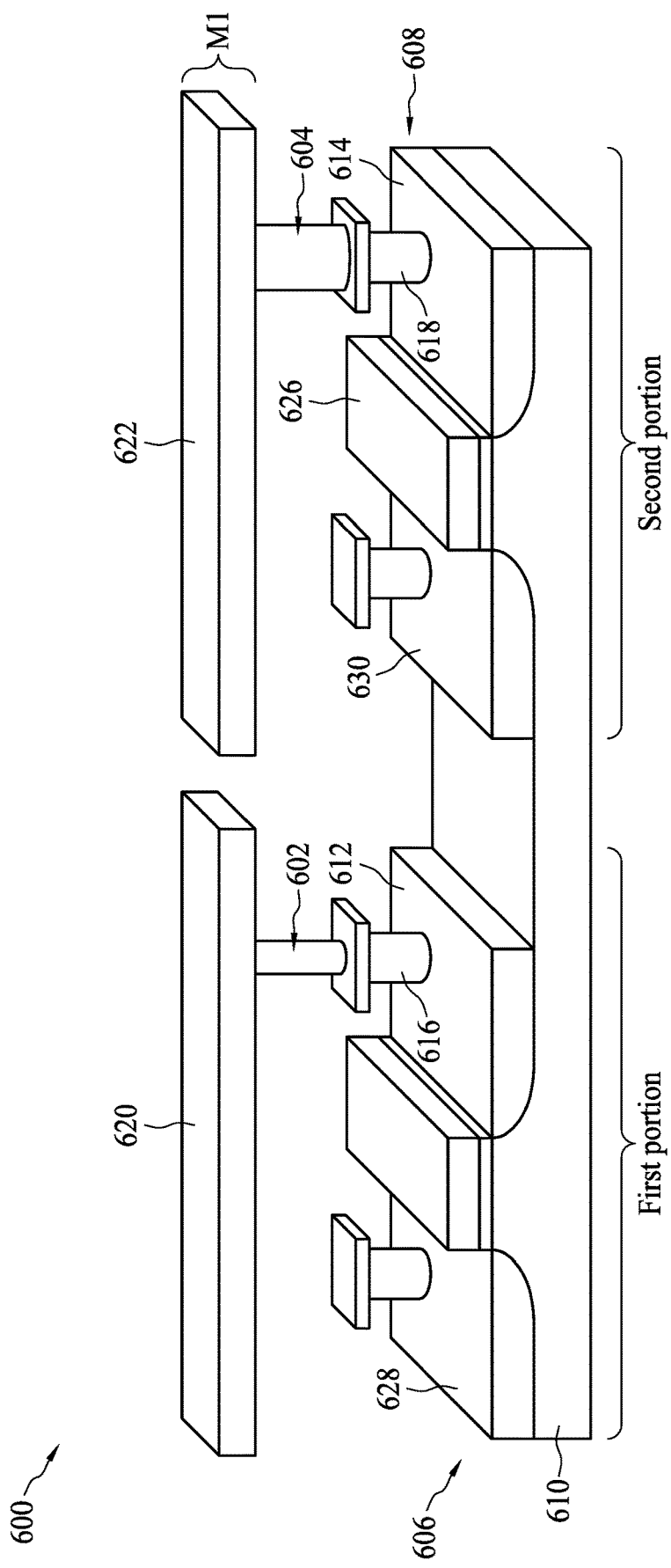
FIG. 6 is a diagram illustrating a storage device in accordance with some embodiments.

FIG. 6 is a diagram illustrating a storage device 600 in accordance with some embodiments. The storage device 600 comprises a first MTJ cell 602, a second MTJ cell 604, a first field-effect transistor 606, and a second field-effect transistor 608. According to some embodiments, the first MTJ cell 602 may be one of the MTJ cells 102_1-102_m of FIG. 2, the first field-effect transistor 606 may be one of the field-effect transistors 106_1-106_m of FIG. 2, the second MTJ cell 606 may be one of the MTJ cells 104_1-104_n of FIG. 2, the second field-effect transistor 608 may be one of the field-effect transistors 108_1-108_n of FIG. 2. The first field-effect transistor 606 and the second field-effect transistor 608 are formed in a semiconductor substrate 610. The first MTJ cell 602 and the second MTJ cell 604 are electrically coupled the first field-effect transistor 606 and the second field-effect transistor 608 respectively. Specifically, the first electrodes of the first MTJ cell 602 and the second MTJ cell 604 are connected to the drains 612 and 614 of the first field-effect transistor 606 and the second field-effect transistor 608 via the contacts 616 and 618 respectively. The second electrodes of the first MTJ cell 602 and the second MTJ cell 604 are connected to the bit lines 620 and 622 of the storage device 600 respectively. The bit lines 620 and 622 may be formed in the first metal layer (i.e. M0 on the semiconductor substrate 610. The gates 624 and 626 of the first field-effect transistor 606 and the second field-effect transistor 608 are connected to a word line (not shown) of the storage device 600. The sources 628 and 630 of the first field-effect transistor 606 and the second field-effect transistor 608 are connected to the common source line (not shown) of the storage device 600.

According to some embodiments, the first MTJ cell 602 and the second MTJ cell 604 are formed in a dielectric layer (not shown) between the semiconductor substrate 610 and the first metal layer M1 on the semiconductor substrate 610. However, this is not a limitation of the present embodiments. In some other embodiments, the first MTJ cell 602 and the second MTJ cell 604 may be formed in any dielectric layer (not shown) between two metal layers (e.g. M3 and M4) on the semiconductor substrate 610.

Figure 7:
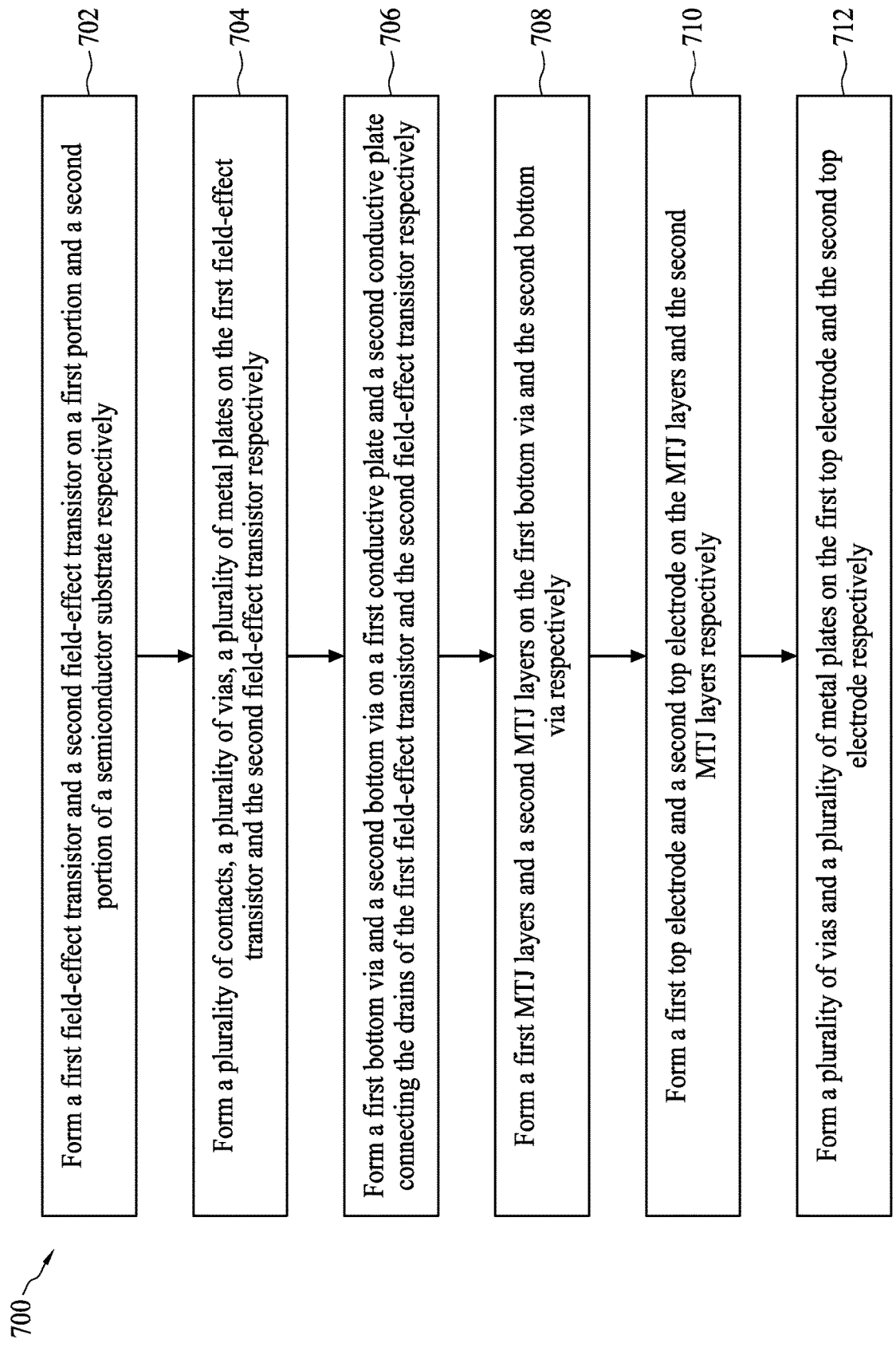
FIG. 7 is a flowchart illustrating a method of forming a storage device in accordance with some embodiments.
Figure 8A:
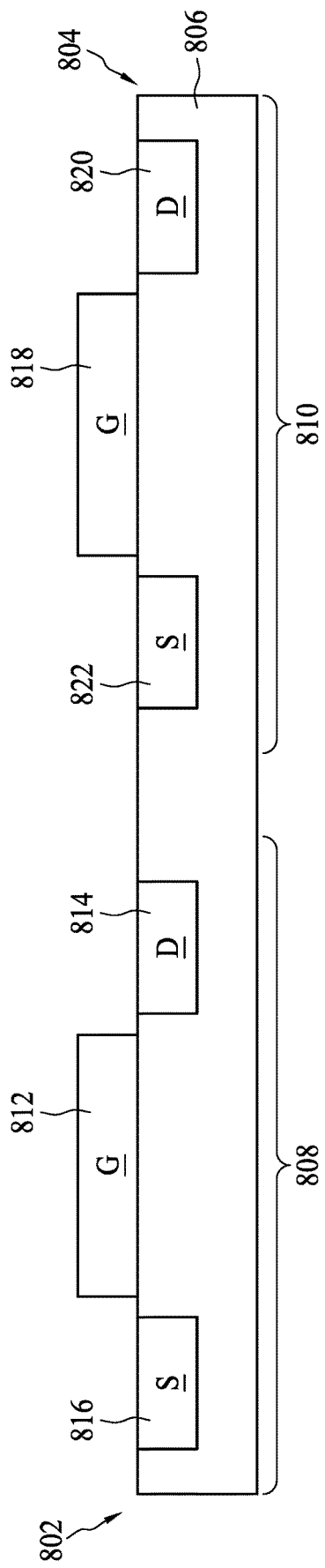
FIG. 8A is a cross-sectional diagram illustrating two field-effect transistors formed on a semiconductor substrate in accordance with some embodiments.
Figure 8B:
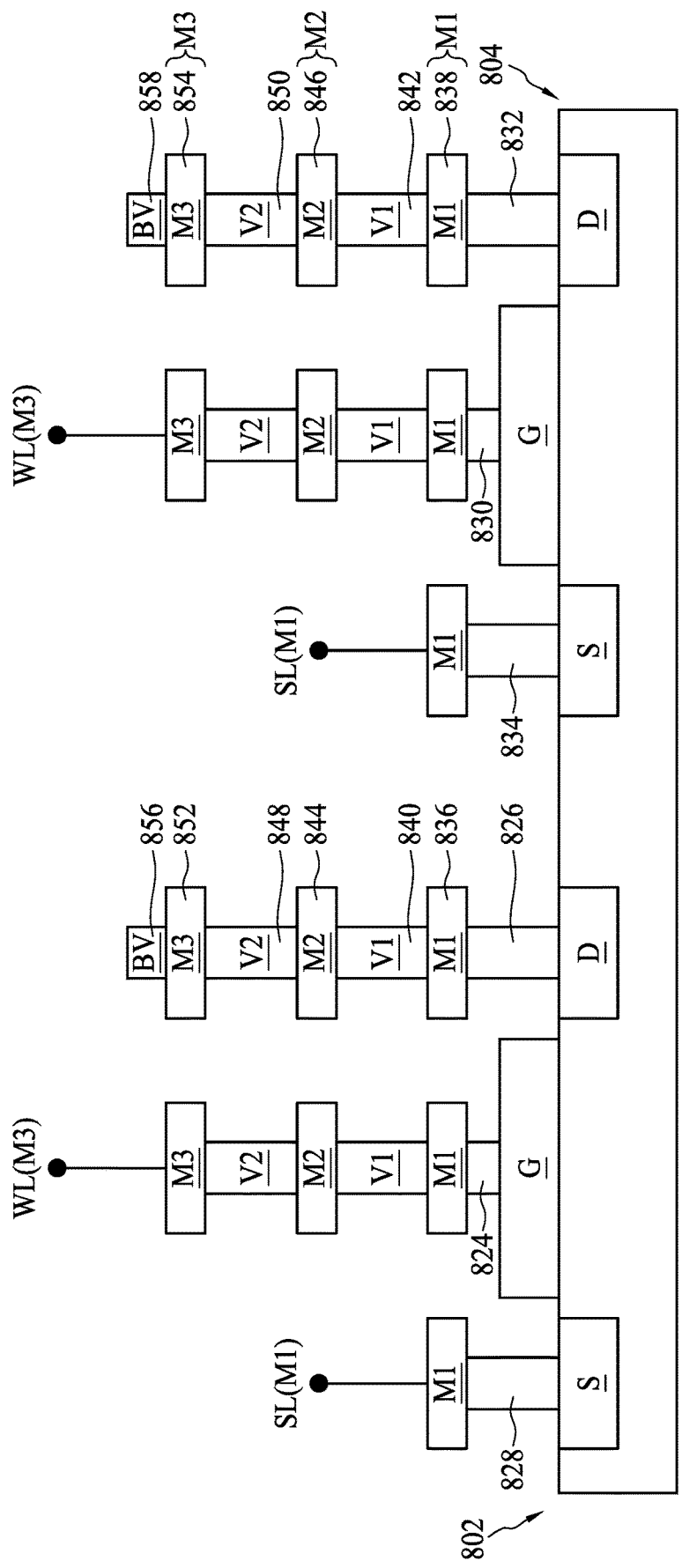
FIG. 8B is a cross-sectional diagram illustrating two bottom vias formed on the field-effect transistors in accordance with some embodiments.
Figure 8C:
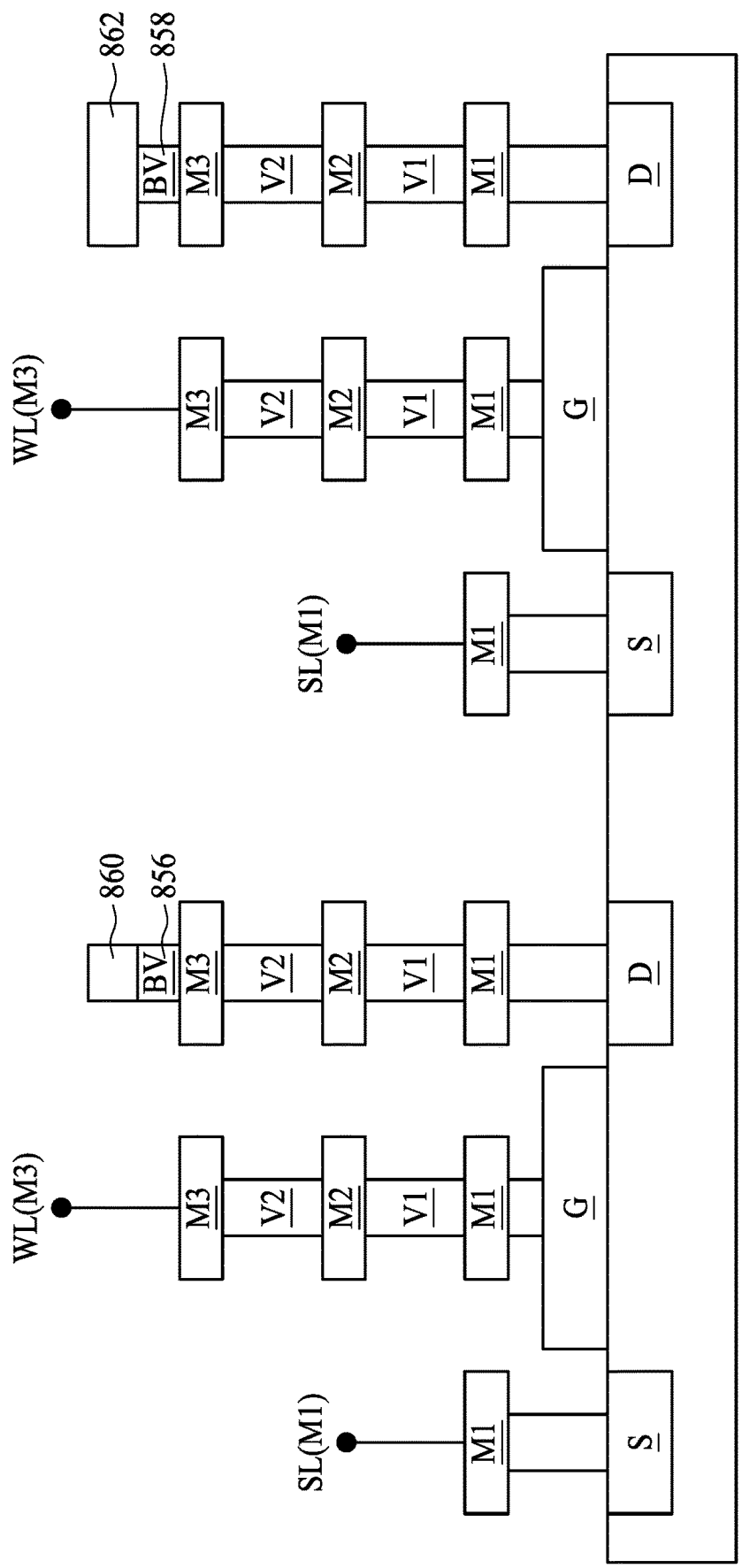
FIG. 8C is a cross-sectional diagram illustrating two MTJ layers formed on the bottom vias in accordance with some embodiments.
Figure 8D:
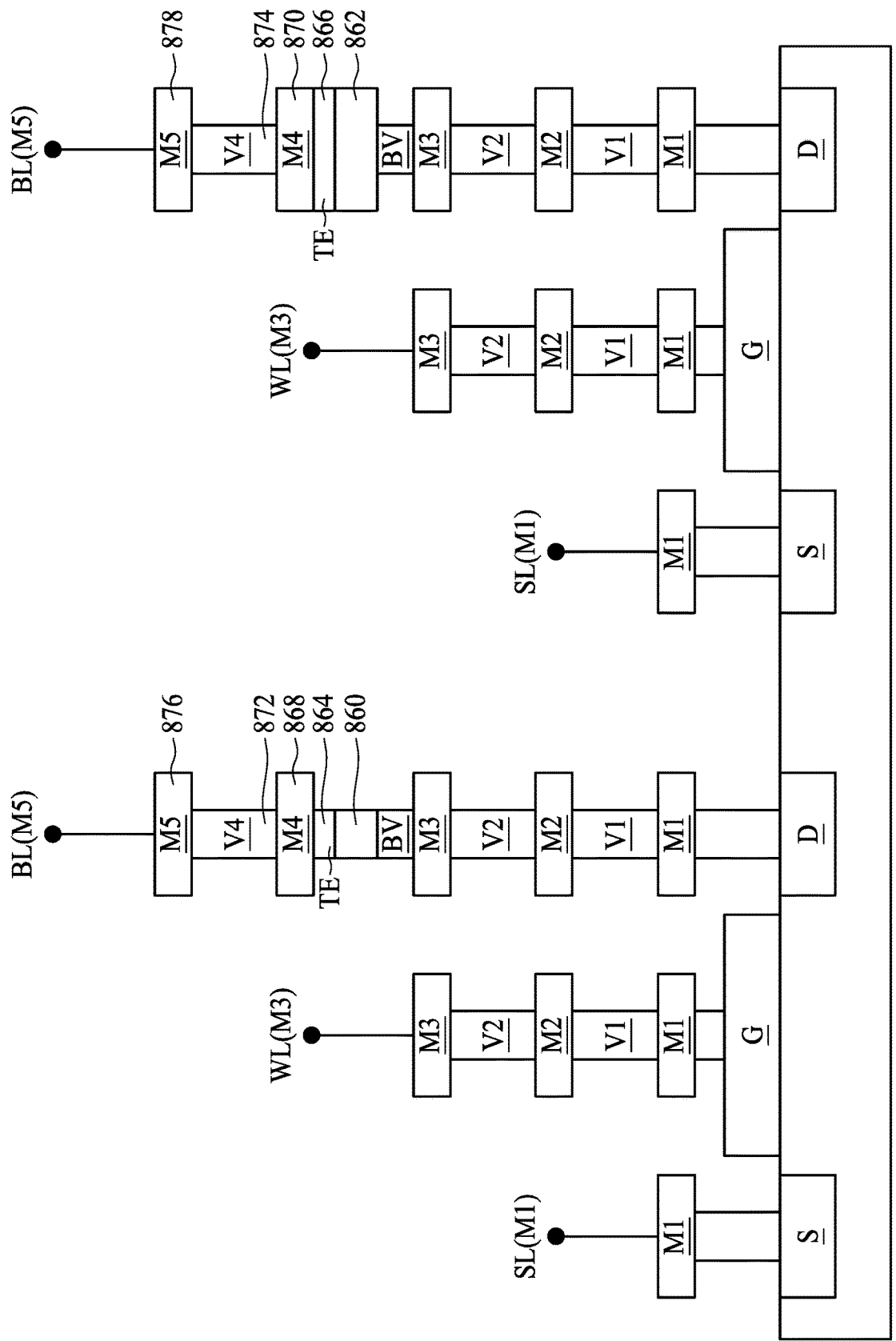
FIG. 8D is a cross-sectional diagram illustrating two top electrodes formed on the MTJ layers in accordance with some embodiments.

FIG. 7 is a flowchart illustrating a method 700 of forming a storage device in accordance with some embodiments. The method 700 may be applied to form the above mentioned storage devices 100, 200, 500, or 600. The method 700 comprises operations 702-712. For brevity, the storage device merely comprises two MTJ cells and two field-effect transistors as shown in FIG. 8A-FIG. 8D. FIG. 8A is a cross-sectional diagram illustrating two field-effect transistors formed on a semiconductor substrate in accordance with some embodiments. FIG. 8B is a cross-sectional diagram illustrating two bottom vias formed on the field-effect transistors in accordance with some embodiments. FIG. 8C is a cross-sectional diagram illustrating two MTJ layers formed on the bottom vias in accordance with some embodiments. FIG. 8D is a cross-sectional diagram illustrating two top electrodes formed on the MTJ layers in accordance with some embodiments.

In operation 702 and FIG. 8A, a first field-effect transistor 802 and a second field-effect transistor 804 are formed on a semiconductor substrate 806. The first field-effect transistor 802 and the second field-effect transistor 804 are located on the first portion 808 and the second portion 810 of the semiconductor substrate 806 respectively. The second portion 810 may be surrounded or adjacent to the first portion 808 viewing from the top of the semiconductor substrate 806. The first field-effect transistor 802 comprises a gate 812 (i.e. G), a drain 814 (i.e. D), and a source 816 (i.e. S). The second field-effect transistor 804 comprises a gate 818, a drain 820, and a source 822.

In operations 704-706 and FIG. 8B, a plurality of contacts 824, 826, 828, 830, 832, and 834 are formed on the gate 812, the drain 814, and the source 816 of field-effect transistor 802 and the gate 818, the drain 820, and the source 822 of field-effect transistor 804 respectively. In addition, a plurality of conductive plates (e.g. 836 and 838) are formed in the first conductive layer M1 for connecting the field-effect transistor 802 and the field-effect transistor 804 respectively. A plurality of first vias V1 (e.g. 840 and 842) are formed on the conductive plates (e.g. 836 and 838). A plurality of conductive plates (e.g. 844 and 846) are formed in the second conductive layer M2 for connecting the vias (e.g. 840 and 842). A plurality of second vias V2 (e.g. 848 and 850) are formed on the conductive plates (e.g. 844 and 846). A plurality of conductive plates (e.g. 852 and 854) are formed in the third conductive layer M3 for connecting the vias (e.g. 848 and 850). A first bottom via (BV) 856 and a second bottom via 858 are formed on the conductive plates 852 and 854 for electrically connecting the drains of the field-effect transistors 802 and 804 respectively. According to some embodiments, the first bottom via 856 and the second bottom via 858 may have the same cross-sectional surface area. In addition, the gates 812 and 818 are electrically connected to the word line WL(M3) formed on the third conductive layer M3. The sources 816 and 820 are electrically connected to the common source line SL(M1) formed on the first conductive layer M1.

In operation 708 and FIG. 8C, a first MTJ layers 860 and a second MTJ layers 862 are formed on the first bottom via 856 and the second bottom via 858 respectively. An MTJ layers may comprise a thin insulating layer formed between two ferromagnetic layers. One ferromagnetic layer may be referred to as the reference layer. The other ferromagnetic layer may be referred to as the free layer. According to some embodiments, the cross-sectional surface area of the second MTJ layers 862 is greater than the cross-sectional surface area of the first MTJ layers 860 as shown in FIG. 5.

In operations 710-712 and FIG. 8D, a first top electrode 864 and a second top electrode 866 are formed on the first MTJ layers 860 and a second MTJ layers 862 respectively. According to some embodiments, the cross-sectional surface area of the first top electrode 864 is similar to the cross-sectional surface area of the first MTJ layers 860, and the cross-sectional surface area of the second top electrode 866 is similar to the cross-sectional surface area of the second MTJ layers 862. In addition, a first conductive plate 868 and a second conductive plate 870 on the fourth conductive layer M4 are formed on the first top electrode (TE) 864 and the second top electrode 866 respectively. The fourth vias (V4) 872 and 874 are formed on the first conductive plate 868 and the second conductive plate 870 respectively. A first conductive plate 876 and a second conductive plate 878 on the fifth conductive layer M5 are formed on the vias 872 and 874, respectively, for connecting the first top electrode 864 and the second top electrode 866 to the bit lines BL(M5).

Briefly, in the present embodiments, a plurality of dummy MTJ cells are formed on the peripheral of the normal MTJ cells for storing the trim codes of the normal cells. The sizes of the dummy MTJ cells are greater than the normal MTJ cells to have better thermal stability. Moreover, at least one detecting circuit is arranged to read the trim codes stored in the dummy MTJ cells, and the detecting circuit is different from the detecting circuit used to access the normal MTJ cells. In comparison to the related art that using e-fuse circuit to store the trim codes, the area of the present storage device may be reduced. In addition, due to the memory characteristic of the dummy MTJ cells, the dummy MTJ cells in the present storage device are rewritable while the e-fuse circuit can only be written one time.

In some embodiments, the present disclosure provides a storage device. The storage device comprises a plurality of first magnetic tunnel junction (MTJ) cells and a plurality of second MTJ cells. The plurality of first MTJ cells are disposed on a first portion of a substrate. The plurality of second MTJ cells are disposed on a second portion different from the first portion of the substrate. Each of the plurality of first MTJ cells has a first cross-sectional surface area viewing from a top of the substrate, each of the plurality of second MTJ cells has a second cross-sectional surface area viewing from the top of the substrate, and the second cross-sectional surface area is greater than the first cross-sectional surface area.

In some embodiments, the present disclosure also provides a storage device. The storage device comprises a first magnetic tunnel junction (MTJ) cell, a second MTJ cell, a first detecting circuit, and a second detecting circuit. The first MTJ cell is disposed on a substrate. The second MTJ cell is disposed on the substrate. The first detecting circuit is coupled to the first MTJ cell, for detecting a resistance of the first MTJ cell. The second detecting circuit is coupled to the second MTJ cell, for detecting the resistance of the second MTJ cell.

In some embodiments, the present disclosure also provides a method of forming a storage device. The method comprises: forming a plurality of first field-effect transistors on a first portion of a substrate; forming a plurality of second field-effect transistors on a second portion different from the first portion of the substrate; forming a plurality of first magnetic tunnel junction (MTJ) cells on the plurality of first field-effect transistors respectively; and forming a plurality of second MTJ cells on the plurality of second field-effect transistors respectively; wherein each of the plurality of first MTJ cell has a first cross-sectional surface area viewing from a top of the substrate, each of the plurality of second MTJ cell has a second cross-sectional surface area viewing from the top of the substrate, and the first cross-sectional surface area is greater than the second cross-sectional surface area.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A storage device, comprising:
   a plurality of first magnetic tunnel junction (MTJ) cells, disposed on a first portion of a substrate; and
   a plurality of second MTJ cells, disposed on a second portion different from the first portion of the substrate;
   wherein each of the plurality of first MTJ cells has a first cross-sectional surface area viewing from a top of the substrate, each of the plurality of second MTJ cells has a second cross-sectional surface area viewing from the top of the substrate, and the second cross-sectional surface area is greater than the first cross-sectional surface area; the storage further comprises:
   a controlling device, coupled to the plurality of first MTJ cells and the plurality of second MTJ cells, the controlling device being arranged for utilizing one of a first reference current and a second reference current greater than the first reference current to detect a resistive state of at least one MTJ cell according to whether the at least one MTJ cell is at least one of the plurality of first MTJ cells or at least one of the plurality of second MTJ cells, wherein when the at least one MTJ cell is the at least one of the plurality of first MTJ cells having the first cross-sectional surface area, the controlling device is arranged for detecting the resistive state of the at least one MTJ cell by comparing a current passing through the at least one MTJ cell with a first reference current; when the at least one MTJ cell is the at least one of the plurality of second MTJ cells having the second cross-sectional surface area greater than the first cross-sectional surface area, the controlling device is arranged for detecting the resistive state of the at least one MTJ cell by comparing the current passing through the at least one MTJ cell with the second reference current.

2. The storage device of claim 1, wherein the first portion is surrounded by the second portion viewing from the top of the substrate.

3. The storage device of claim 1, wherein the plurality of second MTJ cells are arranged to store trim codes, and the controlling device is further arranged to control the plurality of first MTJ cells according to the trim codes stored in the plurality of second MTJ cells.

4. The storage device of claim 3, wherein the controlling device comprises:
   a first detecting circuit, coupled to the plurality of first MTJ cells, for detecting the resistive state of the at least one of the plurality of first MTJ cells according to the first reference current; and
   a second detecting circuit, coupled to the plurality of second MTJ cells, for detecting the resistive state of the at least one of the plurality of second MTJ cells according to the second reference current.

5. The storage device of claim 1, wherein the controlling device comprises:
   a first detecting circuit, coupled to the plurality of first MTJ cells, for detecting the resistive state of the at least one of the plurality of first MTJ cells according to the first reference current; and
   a second detecting circuit, coupled to the plurality of second MTJ cells, for detecting the resistive state of the at least one of the plurality of second MTJ cells according to the second reference current.

6. The storage device of claim 1, wherein when the second MTJ cells are in an anti-parallel state, a current flowing through each MTJ cell of a predetermined percentage of the second MTJ cells is at a first current level; when the second MTJ cells are in a parallel state, a current flowing through each MTJ cell of the predetermined percentage of the second MTJ cells is at a second current level; a current level of the second reference current is higher than the first current level and lower than the second current level.

7. The storage device of claim 1, wherein the shapes of the plurality of first MTJ cells and the plurality of second MTJ cells are circular cylinder.

8. The storage device of claim 1, wherein the shapes of the plurality of first MTJ cells and the plurality of second MTJ cells are elliptical cylinder.

9. The storage device of claim 1, wherein the shapes of the plurality of first MTJ cells and the plurality of second MTJ cells are cuboid.

10. A storage device, comprising:
    a first magnetic tunnel junction (MTJ) cell, disposed on a substrate and having a first thermal stability factor;
    a second MTJ cell, disposed on the substrate and arranged to store trim codes, wherein the second MTJ cell has a second thermal stability factor larger than the first thermal stability factor;
    a first detecting circuit, coupled to the first MTJ cell, for detecting a resistive state of the first MTJ cell by comparing a first current passing through the first MTJ cell with a first reference current; and a second detecting circuit, coupled to the second MTJ cell, for detecting a resistive state of the second MTJ cell, having the second thermal stability factor larger than the first thermal stability factor of the first MTJ cell, by comparing a second current passing through the second MTJ cell with a second reference current greater than the first reference current.

11. The storage device of claim 10, further comprising:
a first field-effect transistor, coupled to the first MTJ cell, for conducting the first current to pass through the first MTJ cell; and
a second field-effect transistor, coupled to the second MTJ cell, for conducting the second current to pass through the first MTJ cell.

12. The storage device of claim 11, wherein when the first current is greater than the first reference current, a resistance of the first MTJ cell is a first resistance;
when the first current is smaller than the first reference current, the resistance of the first MTJ cell is a second resistance greater than the first resistance; when the second current is greater than the second reference current, the resistance of the second MTJ cell is a third resistance; when the second current is smaller than the second reference current, the resistance of the second MTJ cell is a fourth resistance greater than the third resistance.

13. The storage device of claim 10, wherein the first MTJ cell has a first cross-sectional surface area viewing from the top of the substrate, the second MTJ cell has a second cross-sectional surface area viewing from the top of the substrate, and the second cross-sectional surface area is greater than the first cross-sectional surface area.

14. A method of forming a storage device, comprising:
forming a plurality of first field-effect transistors on a first portion of a substrate;
forming a plurality of second field-effect transistors on a second portion different from the first portion of the substrate;
forming a plurality of first conductive plates to electrically connect respective top sides of the plurality of first field-effect transistors, respectively;
forming a plurality of first magnetic tunnel junction (MTJ) cells on the plurality of first conductive plates respectively; and
forming a plurality of second MTJ cells on the plurality of second field-effect transistors respectively;
wherein each of the plurality of first MTJ cell has a first cross-sectional surface area viewing from a top of the substrate, each of the plurality of second MTJ cell has a second cross-sectional surface area viewing from the top of the substrate, and the first cross-sectional surface area is greater than the second cross-sectional surface area; wherein forming the plurality of first MTJ cells comprises:
forming a plurality of first bottom vias on the plurality of first conductive plates respectively;
forming a plurality of first MTJ layers on the plurality of first bottom vias respectively, wherein the plurality of first MTJ layers are in contact with the plurality of first bottom vias respectively, and a width of each of the plurality of first MTJ layers is wider than a width of a corresponding first bottom via in a direction parallel to a top surface of a corresponding first conductive plate; and
forming a plurality of first top electrodes on the plurality of first MTJ layers respectively.

15. The method of claim 14, further comprising:
forming a plurality of second conductive plates to electrically connect respective top sides of the plurality of second field-effect transistors, respectively, wherein the plurality of second MJT cells are disposed on the plurality of second conductive plates, respectively, to be electrically coupled to the plurality of second field-effect transistors, respectively.

16. The method of claim 15, wherein forming the plurality of second MTJ cells comprises:
forming a plurality of second bottom vias on a plurality of second conductive plates respectively;
forming a plurality of second MTJ layers on the plurality of second bottom vias respectively; and
forming a plurality of second top electrodes on the plurality of second MTJ layers respectively.

17. The method of claim 16, wherein the plurality of second bottom vias are in contact with the plurality of second conductive plates respectively, the plurality of second MTJ layers are in contact with the plurality of second bottom vias respectively, and a width of one of the plurality of second conductive plates is wider than a width of a corresponding second bottom via in a direction parallel to a top surface of the one of the plurality of second conductive plates.

18. The method of claim 14, wherein the shapes of the plurality of first MTJ cells and the plurality of second MTJ cells are circular cylinder.

19. The method of claim 14, wherein the shapes of the plurality of first MTJ cells and the plurality of second MTJ cells are elliptical cylinder.

20. The method of claim 14, wherein the shapes of the plurality of first MTJ cells and the plurality of second MTJ cells are cuboid.

* * * * *